United States Patent
Nakanishi et al.

(10) Patent No.: US 8,278,698 B2
(45) Date of Patent: Oct. 2, 2012

(54) NONVOLATILE MEMORY DEVICE AND METHOD OF FORMING THE SAME

(75) Inventors: Toshiro Nakanishi, Seongnam-si (KR); Chanjin Park, Yongin-si (KR); Siyoung Choi, Seongnam-si (KR); Bonyoung Koo, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 292 days.

(21) Appl. No.: 12/703,066

(22) Filed: Feb. 9, 2010

(65) Prior Publication Data
US 2010/0213536 A1    Aug. 26, 2010

(30) Foreign Application Priority Data
Feb. 20, 2009 (KR) .................. 10-2009-0014449

(51) Int. Cl.
*H01L 29/792* (2006.01)

(52) U.S. Cl. .. 257/324; 257/315; 257/326; 257/E27.078

(58) Field of Classification Search .................. 257/324, 257/315, E27.078, 326
See application file for complete search history.

(56) References Cited

U.S. PATENT DOCUMENTS

| 2006/0038220 | A1  | 2/2006  | Kusters et al. |
| 2006/0284245 | A1  | 12/2006 | Park et al. |
| 2008/0105919 | A1* | 5/2008  | Lim et al. ..................... 257/324 |
| 2008/0283905 | A1* | 11/2008 | Won ............................. 257/326 |

FOREIGN PATENT DOCUMENTS

| JP | 2006-339599 | 12/2006 |
| KR | 10-2006-0132418 | 12/2006 |

OTHER PUBLICATIONS

English Abstract for Publication No. 2006-339599.
English Abstract for Publication No. 10-2006-0132418.
Y. Kamigaki, et al., "A New Portrayal of Electron and Hole Traps in Amorphous Silicon Nitride," J. Appl. Phys., vol. 68, 2211 (1990).
K. Shiraishi, et al., "Theoretical Studies on the Charge Trap Mechanism of Monos-Type Memory," Silicon Technology Subcommittee, Applied Physics Society, Jun. 9, 2008.

* cited by examiner

*Primary Examiner* — Long Tran
(74) *Attorney, Agent, or Firm* — F. Chau & Associates, LLC (57) ABSTRACT

A nonvolatile memory device includes a device isolation pattern, a charge trap layer, and a plurality of word lines. The device isolation pattern defines an active region in a semiconductor substrate and extends in a first direction. The charge trap layer covers the active region and the device isolation pattern. The word lines on the charge trap layer cross the active region and extend in a second direction. The charge trap layer disposed in a first region where the word line and the active region cross each other has a different nitrogen content ratio from the charge trap layer disposed in a second region surrounding the first region.

9 Claims, 9 Drawing Sheets

NONVOLATILE MEMORY DEVICE AND METHOD OF FORMING THE SAME

CROSS-REFERENCE TO RELATED APPLICATIONS

This patent application claims priority under 35 U.S.C. §119 from Korean Patent Application No. 10-2009-0014449, filed on Feb. 20, 2009, the contents of which are herein incorporated by reference in their entirety.

BACKGROUND

The present disclosure is directed to a semiconductor memory device and a method of forming the same, and more particularly, to a nonvolatile memory device and a method of forming the same.

Generally, semiconductor memory devices may be classified into volatile memory devices and nonvolatile memory devices. Volatile memory devices lose stored data when powered off, whereas nonvolatile memory devices retain stored data even when powered off. Flash memory devices, which are nonvolatile memory devices, are highly integrated devices developed by combining Erasable Programmable Read Only Memories (EPROM) that are programmable and erasable with Electrically Erasable Programmable Read Only Memories (EEPROM) that are electrically programmable and erasable.

Flash memory devices may have structures in which a floating gate for storing data and a control gate for controlling the floating gate are sequentially stacked. The structure may hinder down-scaling of a memory device because of the vertical height of the floating gate. Accordingly, flash memory devices using a charge trap layer are being developed to not only reduce the vertical height of a memory cell and but also to maintain retention characteristics for long-lasting maintenance of stored data.

SUMMARY

The present disclosure provides a nonvolatile memory device having enhanced reliability and a method of forming the same.

Embodiments of the inventive concept provide nonvolatile memory devices including: a device isolation pattern defining an active region in a semiconductor substrate and extending in a first direction; a charge trap layer covering the active region and the device isolation pattern; and a plurality of word lines on the charge trap layer, the word lines crossing the active region and extending in a second direction, wherein the charge trap layer disposed in a first region where the word lines and the active region cross each other has a different nitrogen content ratio from the charge trap layer disposed in a second region surrounding the first region.

In some embodiments, the charge trap layer disposed in the first region may have a smaller nitrogen content ratio than the charge trap layer disposed in the second region.

In other embodiments, the charge trap layer may include silicon nitride, and the charge trap layer disposed in the second region may have a greater nitrogen content ratio than a stoichiometric nitrogen content ratio.

In still other embodiments, the number of trap sites in the first region of the charge trap layer may be greater than the number of trap sites in the second region of the charge trap layer.

In even other embodiments, the active region in the first region may have an upper surface higher than an upper surface of the device isolation pattern.

In yet other embodiments, the upper surface in the first region of the active region may have an arched shape protruding from a surface of the semiconductor substrate.

In further embodiments, the upper surface of the active region may include a flat center part, and a round edge part between the flat center part and the upper surface of the device isolation pattern.

In still further embodiments, the first region of the active region in may have an upper surface with a height identical to or lower than a height of an upper surface of the device isolation pattern.

In other embodiments, methods of forming a nonvolatile memory device include: forming a pad oxide and a mask pattern on a semiconductor substrate; etching the semiconductor substrate using the pad oxide and the mask pattern as a mask to form a device isolation pattern defining an active region in the semiconductor substrate and extending in a first direction; forming a charge trap layer covering the active region and the device isolation pattern; forming a dielectric layer on the charge trap layer; forming a first mask pattern extending in the first direction and covering the active region; implanting nitrogen into the charge trap layer on the device isolation pattern using the first mask pattern as a mask; forming a second mask pattern on the dielectric layer extending in a second direction and the active region; and implanting nitrogen into the charge trap layer using the second mask pattern as a mask.

In some embodiments, the second mask pattern may include word lines and mask lines.

In other embodiments, the method includes recessing the device isolation pattern by performing an etching process using the mask pattern as a mask.

In other embodiments, the method includes shaping the upper surface of the active region by supplying a gas that reacts with silicon where an edge part of the upper surface of the active region more rapidly reacts with the supplied gas, and where a shape of the upper surface is determined by varying a reaction time and a concentration of the gas.

In other embodiments, the method includes forming a tunnel insulating layer on the active region.

In other embodiments, the dielectric layer is multilayered.

Other embodiments provide nonvolatile memory devices including: a plurality of active regions extending in a first direction in a semiconductor substrate, said active regions separated by a device isolation pattern; a charge trap layer covering the active region and the device isolation pattern; a dielectric layer covering the charge trap layer; a plurality of word lines extending in a second direction on the dielectric layer, wherein said word lines cross the active regions, wherein a first region of the charge trap layer where the word lines and the active regions cross each other has a smaller nitrogen content ratio than a second region of the charge trap layer, wherein the second region surrounds the first region.

DETAILED DESCRIPTION OF EXEMPLARY EMBODIMENTS

Exemplary embodiments of the inventive concept will be described below in more detail with reference to the accompanying drawings. The invention may, however, be embodied in different forms and should not be construed as limited to the embodiments set forth herein.

Figure 1:
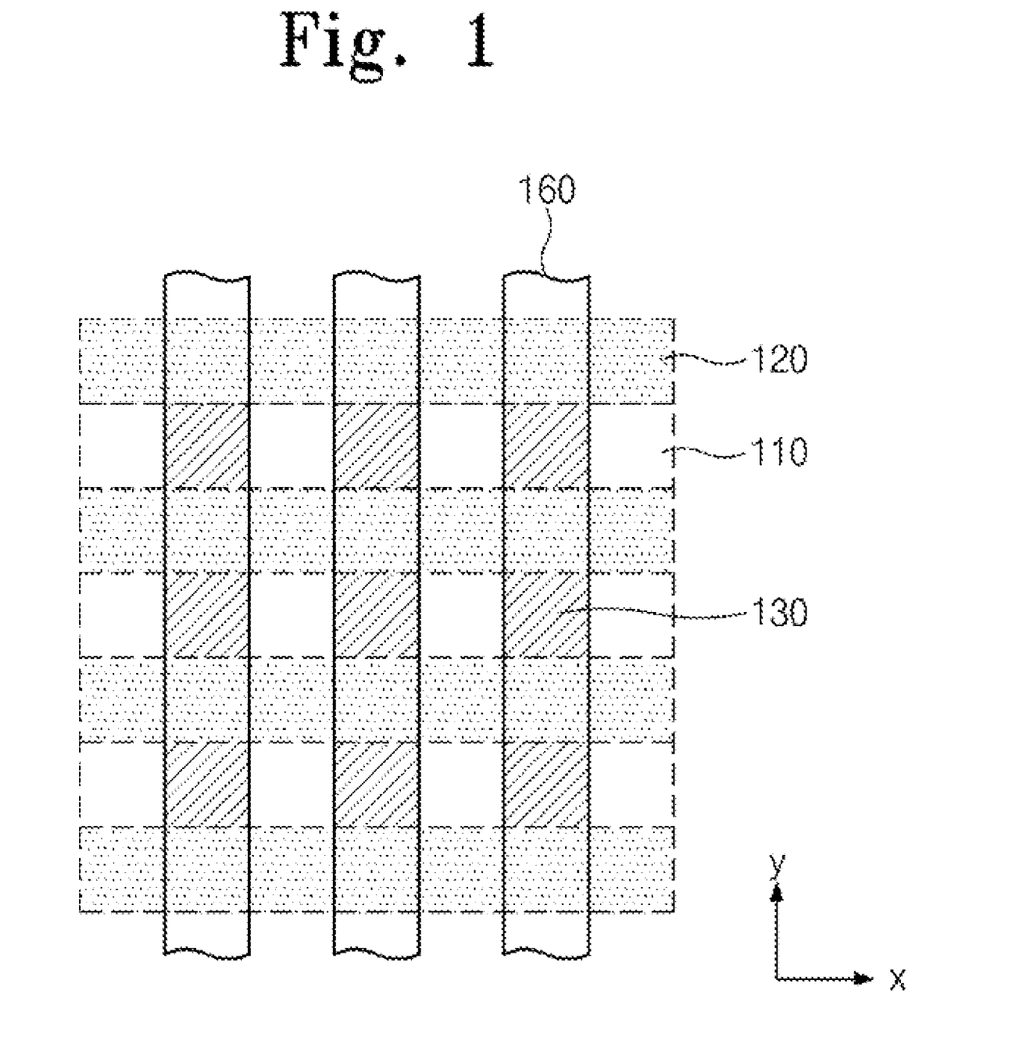
FIGS. 1 and 2 are diagrams illustrating a nonvolatile memory device according to an embodiment.
Figure 2:
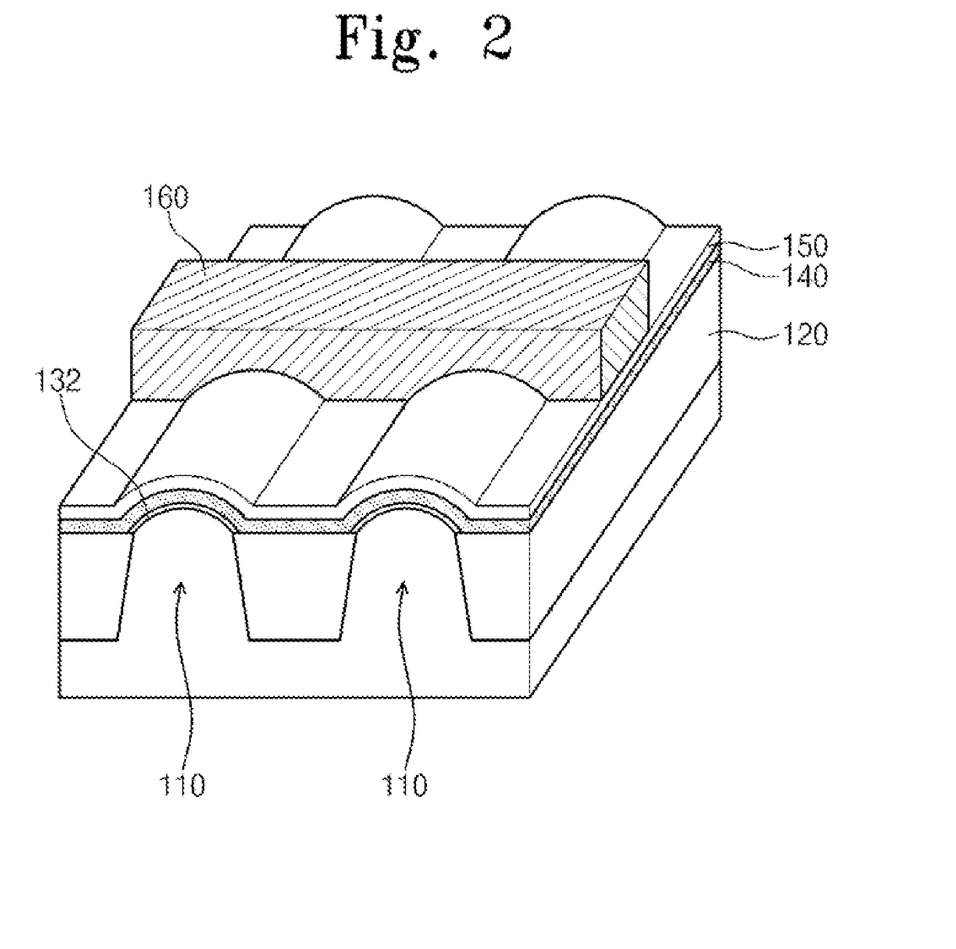

FIGS. 1 and 2 are diagrams illustrating a nonvolatile memory device according to an embodiment.

Referring to FIGS. 1 and 2, a device isolation pattern 120 is provided to define an active region 110 of a semiconductor substrate. The device isolation pattern 120 is extended in a first direction, for example, an x-direction. The device isolation pattern 120 may include silicon oxide. A charge trap layer 140 is disposed to cover the active region 110 and the device isolation pattern 120. The charge trap layer 140 includes silicon nitride. A tunnel insulating layer 132 is disposed between the charge trap layer 140 and the active region 110. The tunnel insulating layer 132 may be formed of various materials such as silicon oxide ($SiO_2$), silicon oxynitride (SiON), and hafnium oxide (HfO). If the tunnel insulating layer 132 is silicon oxide ($SiO_2$), the tunnel insulating layer 132 may have a thickness that does not allow direct tunneling.

A dielectric layer 150 may be disposed on the charge trap layer 140. The dielectric layer 150 may include at least one of silicon oxide ($SiO_2$), aluminum oxide ($Al_2O_3$), lanthanum hafnium oxide (LaHfO), lanthanum aluminum oxide (LaAlO), and dysprosium scandium oxide ($DyScO_3$). A plurality of word lines 160 are disposed on the dielectric layer 150 to cross the active region 110. The word lines 160 may be extended in a second direction, for example, a y-direction. The word lines 160 may include conductive silicon.

The charge trap layer 140 disposed in a first region 130 where the word lines 160 and the active region 110 cross each other has a different nitrogen content ratio from the charge trap layer 140 disposed in a second region surrounding the first region 130. Here, the second region is that portion of the charge trap layer 140 covering the active region 110 and the device isolation pattern 120 excluding the first region 130. That is, the second region may include the active region 110 and the device isolation pattern 120 on both sides of the word lines 160 and the device isolation pattern 120 on both sides of the first region 130. The second region entirely surrounds the first region 130. The first region 130 of the charge trap layer 140 may have a lower nitrogen content ratio than the second region of the charge trap layer 140.

The charge trap layer 140 is silicon nitride, and the nitrogen content ratio in the second region of the charge trap layer 140 may be greater than a stoichiometric nitrogen content ratio. The number of trap sites in the first region 130 of the charge trap layer 140 may be greater than the number of trap sites in the second region of the charge trap layer 140. Thus, electric charges trapped in the first region 130 of the charge trap layer 140 may be inhibited from moving into the second region of the charge trap layer 140 (for example, moving via the trap sites).

Hereinafter, the trap sites of the charge trap layer 140 will be described in detail. The trap site may be caused by the combination structure ($Si_3\equiv Si:N_3\equiv Si$) of the silicon nitride ($Si_3N_4$) (Y. Kamigaki, et al., J. Appl. Phys., Vol. 68, 2211 (1990)). $Si_3\equiv Si^+$ may be an electron trap site, and $N_3\equiv Si^-$ may be a hole trap site. When oxygen is supplied from an oxide adjacent to the charge trap layer 140 to silicon nitride, the hole trap sites are made in a combination structure $N_3\equiv Si-O$ and the hole or electron trap sites are made in a combination structure $N_2=Si=O_2$ (Theoretical Studies on the Charge Trap Mechanism of MONOS-Type Memory, K. SHIRAISHI, et al., Jun. 9, 2008, Silicon Technology Subcommittee, Applied Physics Society).

When nitrogen is supplied to the trap sites, the number of the trap sites may be reduced. Thus, nitrogen is supplied to the second region of the charge trap layer 140 to reduce the number of the trap sites. If the nitrogen content ratio of the second region of the charge trap layer 140 is greater than that of the first region 130 of the charge trap layer 140, a compressive force is generated in the second region of the charge trap layer 140, minimizing the penetration of oxygen. If the penetration of oxygen is minimized, the combination structures $N_3\equiv Si-O$ and $N_2=Si=O_2$ do not occur, reducing the number of the trap sites. Accordingly, electric charges trapped in the first region 130 of the charge trap layer 140 may be inhibited from moving into the second region of the charge trap layer 140 where the number of the trap sites is reduced, improving the retention characteristics of a memory device.

Referring again to FIG. 2, the height of the upper surface of the active region 110 may be higher than the height of the upper surface of the device isolation pattern 120. The upper surface of the active region 110 may have an arched shape protruding from the surface of the semiconductor substrate. When the upper surface of the active region 110 has an arched shape, the upper surfaces of the tunnel insulating layer 132 and the dielectric layer 150 in the first region 130 have arched shapes. The radius of curvature of the tunnel insulating layer 132 in the first region 130 is smaller than that of the dielectric layer 150 in the first region 130. Accordingly, since the electric field is applied more to the tunnel insulating layer 132 than the dielectric layer 150, data program/delete operations may be efficiently performed.

Figure 3:
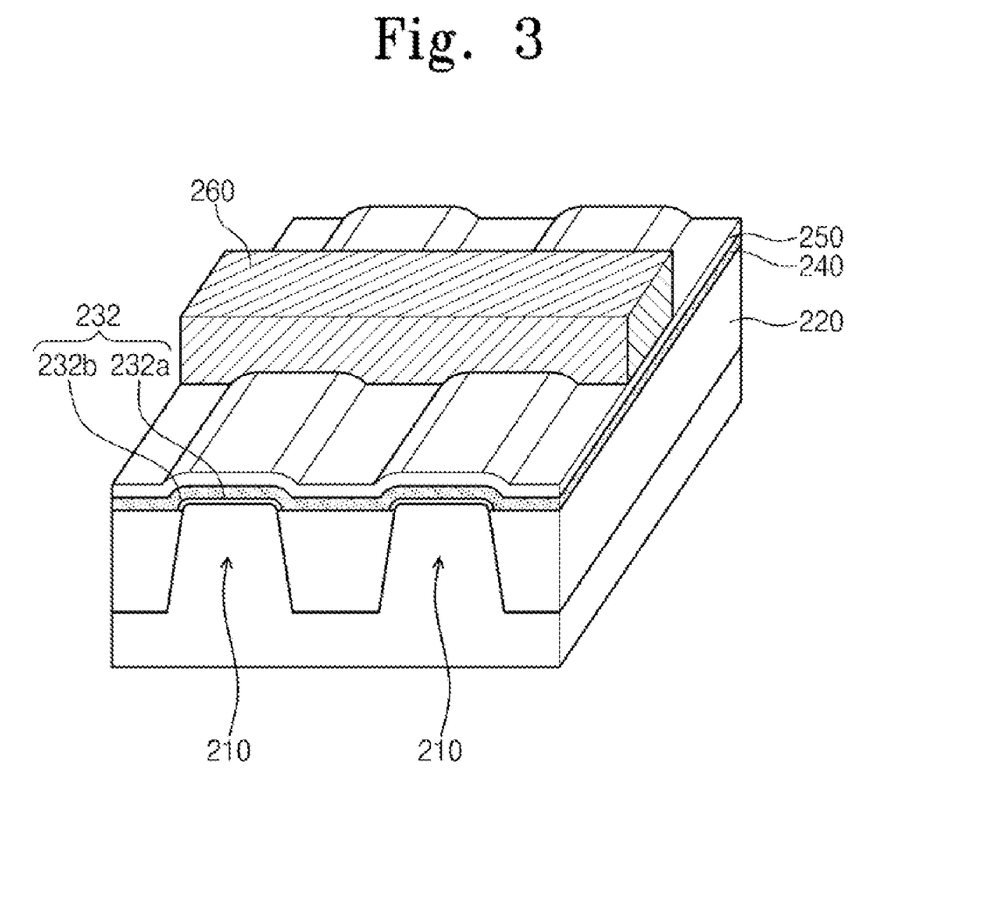
FIG. 3 is a diagram illustrating a nonvolatile memory device according to another embodiment.

FIG. 3 is a diagram illustrating a nonvolatile memory device according to another embodiment. Descriptions of this embodiment are similar to that of the embodiment of FIGS. 1 and 2 except for a difference of the upper surface of the active region. Accordingly, for simplicity in description, descriptions of similar technical features will be omitted below.

Referring to FIG. 3, a device isolation pattern 220 is provided to define an active region 210 of a semiconductor substrate. The device isolation pattern 220 is extended in a first direction, for example, an x-direction (see FIG. 1). The device isolation pattern 220 may include silicon oxide. A charge trap layer 240 is disposed to cover the active region 210 and the device isolation pattern 220. The charge trap layer 240 includes silicon nitride. A tunnel insulating layer 232 is disposed between the charge trap layer 240 and the active region 210. The tunnel insulating layer 232 may be formed of various materials such as silicon oxide ($SiO_2$), silicon oxynitride (SiON), and hafnium oxide (HfO). If the tunnel insulating layer 232 is formed of silicon oxide ($SiO_2$), the tunnel insulating layer 232 may have a thickness that does not allow direct tunneling.

A dielectric layer 250 may be disposed on the charge trap layer 240. The dielectric layer 250 may include at least one of silicon oxide ($SiO_2$), aluminum oxide ($Al_2O_3$), lanthanum hafnium oxide (LaHfO), lanthanum aluminum oxide (LaAlO), and dysprosium scandium oxide (DyScO$_3$). A plurality of word lines 260 are disposed on the dielectric layer 250 to cross the active region 210. The word lines 160 may be extended in a second direction, for example, a y-direction (see FIG. 1). The word lines 160 may include conductive silicon.

The charge trap layer 240 disposed in a first region (130 of FIG. 1) where the word lines 260 and the active region 210 cross each other has a different nitrogen content ratio from the charge trap layer 240 disposed in a second region surrounding the first region. Here, the second region is that portion of the charge trap layer 240 covering the active region 210 and the device isolation pattern 220 excluding the first region. The second region entirely surrounds the first region. The first region of the charge trap layer 240 may have a lower nitrogen content ratio than the second region of the charge trap layer 240.

The charge trap layer 240 is silicon nitride, and the nitrogen content ratio of the second region of the charge trap layer 240 may be greater than a stoichiometric nitrogen content ratio. The number of trap sites in the first region of the charge trap layer 240 may be greater than the number of trap sites in the second region of the charge trap layer 240. Thus, electric charges trapped in the first region of the charge trap layer 240 may be inhibited from moving into the second region of the charge trap layer 240 where the trap sites are reduced, improving the retention characteristics of a memory device.

The height of the upper surface of the active region 210 may be higher than that of the upper surface of the device isolation pattern 220. The upper surface of the active region 210 may include a flat center part 232a and a round edge part 232b between the flat center part 232a and the upper surface of the device isolation pattern 220. The round edge part 232b may inhibit electric field from being concentrated on the edge.

Figure 4:
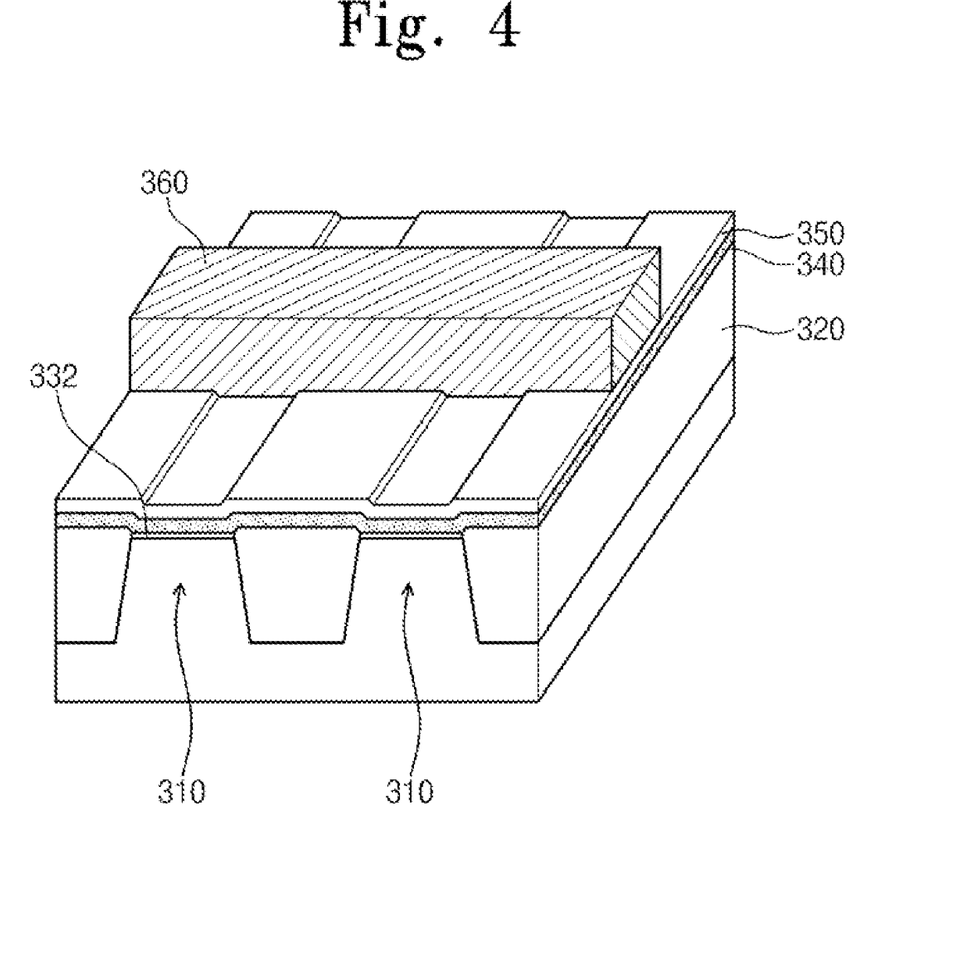
FIG. 4 is a diagram illustrating a nonvolatile memory device according to still another embodiment.

FIG. 4 is a diagram illustrating a nonvolatile memory device according to still another embodiment.

Descriptions of this embodiment are similar to that of the embodiment of FIG. 3 except for a difference of the upper surface of the active region. Accordingly, for simplicity in description, descriptions of similar technical features will be omitted below.

Referring to FIG. 4, a device isolation pattern 320 is provided to define an active region 310 of a semiconductor substrate. The device isolation pattern 320 is extended in a first direction, for example, an x-direction (see FIG. 1). The device isolation pattern 320 may include silicon oxide. A charge trap layer 340 is disposed to cover the active region 310 and the device isolation pattern 320. The charge trap layer 340 includes silicon nitride. A tunnel insulating layer 332 is disposed between the charge trap layer 340 and the active region 310. The tunnel insulating layer 332 may be formed of various materials such as silicon oxide (SiO$_2$), silicon oxynitride (SiON), and hafnium oxide (HfO). If the tunnel insulating layer 332 is silicon oxide (SiO$_2$), the tunnel insulating layer 332 may have a thickness that does not allow direct tunneling.

A dielectric layer 350 may be disposed on the charge trap layer 340. A plurality of word lines 360 are disposed on the dielectric layer 350 to cross the active region 310. The word lines 360 may be extended in a second direction, for example, a y-direction (see FIG. 1). The word lines 360 may include conductive silicon.

The charge trap layer 340 disposed in a first region (130 of FIG. 1) where the word lines 360 and the active region 310 cross each other has a different nitrogen content ratio from the charge trap layer 340 disposed in a second region surrounding the first region. Here, the second region is that portion of the charge trap layer 340 covering the active region 310 and the device isolation pattern 320 excluding the first region. The second region entirely surrounds the first region. The first region of the charge trap layer 340 may have a lower nitrogen content ratio than the second region of the charge trap layer 340.

The charge trap layer 340 is silicon nitride, and the nitrogen content ratio in the second region of the charge trap layer 340 may be greater than a stoichiometric nitrogen content ratio. The number of trap sites in the first region of the charge trap layer 340 may be greater than the number of trap sites in the second region of the charge trap layer 340. Thus, electric charges trapped in the first region of the charge trap layer 340 may be inhibited from moving into the second region, thereby enhancing the retention characteristics of a memory device. The height of the upper surface of the active region 310 may be identical to or lower than the height of the upper surface of the device isolation pattern 320. As described in FIGS. 2 and 3, the upper surface of the first region of the active region may be implemented in various shapes.

FIGS. 5A through 5E are diagrams illustrating a method of forming a nonvolatile memory device according to an embodiment.

Figure 5A:
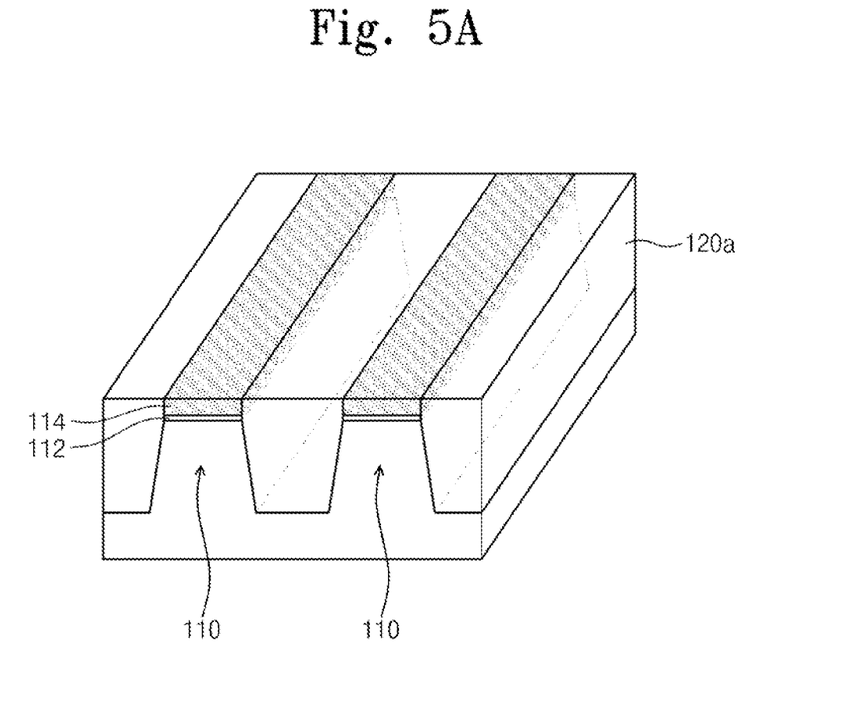
FIGS. 5A through 5E are diagrams illustrating a method of forming a nonvolatile memory device according to an embodiment.

Referring to FIG. 5A, a pad oxide 112 and a mask pattern 114 are formed on a semiconductor substrate. The pad oxide 112 may be formed through thermal oxidation or chemical vapor deposition. The mask pattern 114 may be formed of silicon nitride. An etching process is performed on the semiconductor substrate using the pad oxide 112 and the mask pattern 114 as a mask, forming a device isolation pattern 120a. The device isolation pattern 120a defines an active region 110 in the semiconductor substrate. The forming of the device isolation pattern 120a may include forming a trench on the semiconductor substrate using the mask pattern 114 as a mask and filling an insulating layer into the trench. That is, the device isolation pattern 120a may be formed through a shallow trench isolation process.

Figure 5B:
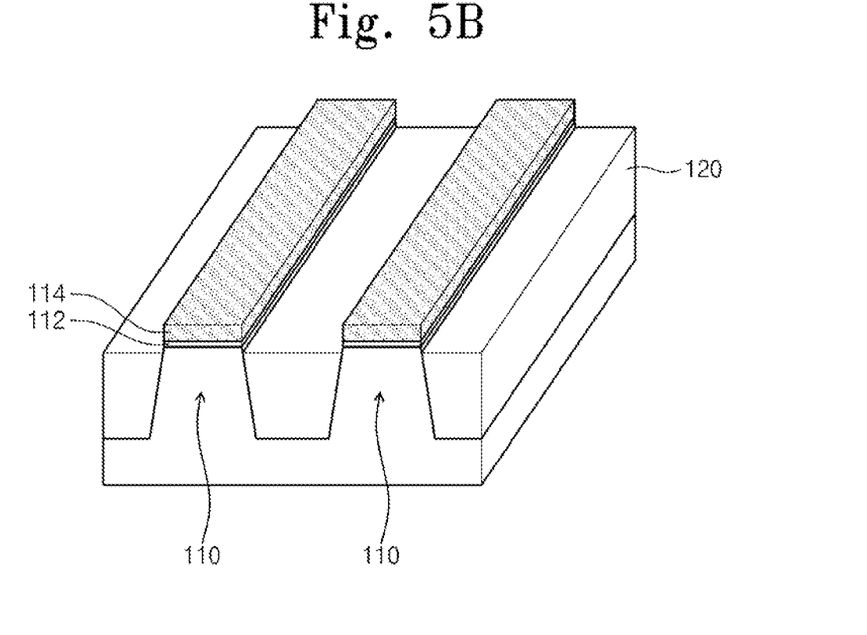

Referring to FIG. 5B, the device isolation pattern 120a is recessed. The recessed upper surface of the device isolation pattern 120a may be lower than the upper surface of the active region 110. The recessed upper surface of the device isolation pattern 120a may be formed by performing an etching process using the mask pattern 114 as a mask.

Figure 5C:
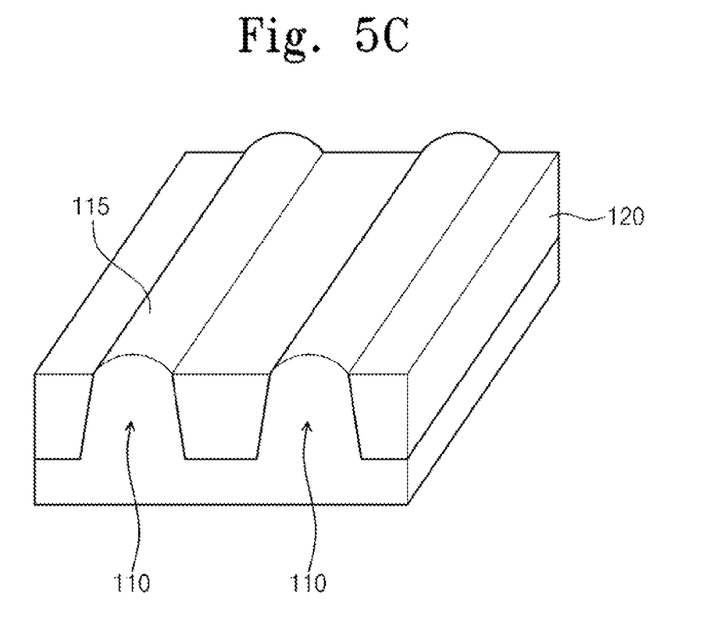

Referring to FIG. 5C, the upper surface 115 of the active region 110 is formed to have an arched shape. A gas that can react with silicon may be supplied to form the upper surface 115 of the active region 110 having an arched shape. Specifically, gases such as nitrogen, oxygen, and hydrogen may be supplied. If hydrogen is supplied, the silicon of the active region 110 may react with the hydrogen, and silane (SiH$_4$) gas may be exhausted. An edge part of the upper surface 115 of the active region 110 may more rapidly react with the supplied gas, forming the upper surface 115 having an arched shape.

Figure 5D:
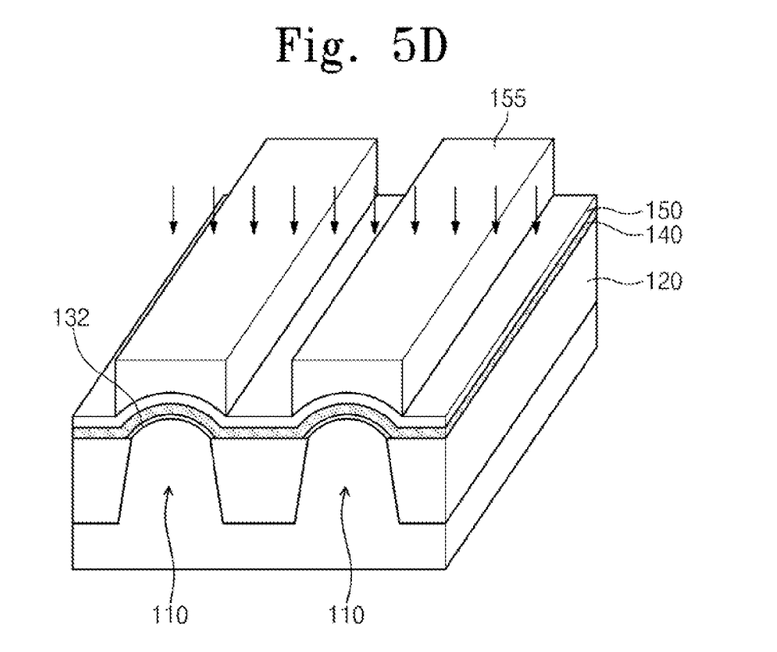

Referring to FIG. 5D, a tunnel insulating layer 132 is formed on the active region 110. The tunnel insulating layer 132 may be formed of silicon oxide using a thermal oxidation process. A charge trap layer 140 is formed on the active region 110 and the device isolation pattern 120. The charge trap layer 140 may be formed of silicon nitride. A dielectric layer 150 may be formed on the charge trap layer 140. The dielectric layer 150 may be formed of silicon oxide. Alternatively, the dielectric layer 150 may be formed to be multi-layered, including a silicon oxide and a high-dielectric layer.

A first mask pattern 155 extending in a first direction (x-direction of FIG. 1) is formed to cover the active region 110. The first mask pattern 155 may be formed of various materials, including a photoresist pattern, an insulating layer, and the like. By using the first mask pattern 155 as a mask, nitrogen is implanted into the charge trap layer 140 on the device isolation pattern 120. The nitrogen may be implanted through various methods, including an ion implantation process and a plasma implantation process.

Figure 5E:
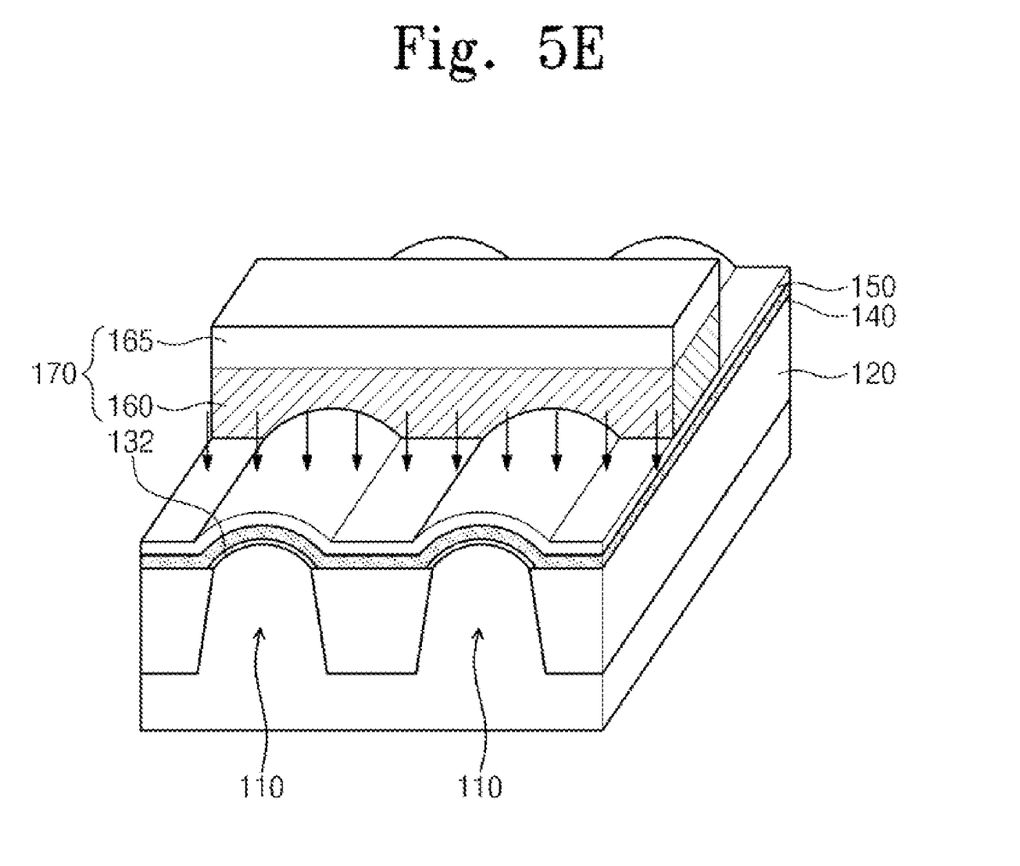

Referring to FIG. 5E, a second mask pattern 170 extending in a second direction (y-direction of FIG. 1) is formed on the dielectric layer 150 to cross the active region 110 and the device isolation pattern 120. The second mask pattern 170 may include word lines 160 and mask lines 165. The mask lines 165 may be formed of a photoresist pattern and/or a nitride pattern. Nitrogen is implanted into the charge trap layer 140 using the second mask pattern 170 as a mask. The nitrogen may be implanted through various methods including an ion implantation process and a plasma implantation process.

According to an embodiment, due to two nitrogen implantation processes on the charge trap layer 140, the first region (130 of FIG. 1) of the charge trap layer 140 where the word lines 160 and the active region 110 cross each other has a different nitrogen content ratio from the second region of the charge trap layer 140 surrounding the first region 130. The first region of the charge trap layer 140 may have a lower nitrogen content ratio than the second region of the charge trap layer 140.

The charge trap layer 140 is silicon nitride, and the nitrogen content ratio in the second region of the charge trap layer 140 may be greater than a stoichiometric nitrogen content ratio. Alternatively, the number of trap sites in the first region 130 of the charge trap layer 140 may be greater than the number of trap sites in the second region of the charge trap layer 140. Thus, electric charges trapped in the first region of the charge trap layer 140 may be inhibited from moving into the second region of the charge trap layer 140.

In a nonvolatile memory device as described in FIGS. 5A through 5E, the upper surface of the active region has an arched shape. On the other hand, in a nonvolatile memory device as described in FIG. 3, the upper surface of the active region has round edge parts. The round edge part may be implemented by reducing the reaction time and the concentration of gas in a process of supplying the gas that can react with silicon as described in FIG. 5C. In a nonvolatile memory device as described in FIG. 4, the upper surface of the active region has a lower height than the upper surface of the device isolation pattern. A nonvolatile memory device of FIG. 4 may be implemented by omitting a recess process of the device isolation pattern described in FIG. 5B.

An active region having a lower upper surface than that of the upper surface of the device isolation pattern described in FIG. 4 may be formed.

Figure 6:
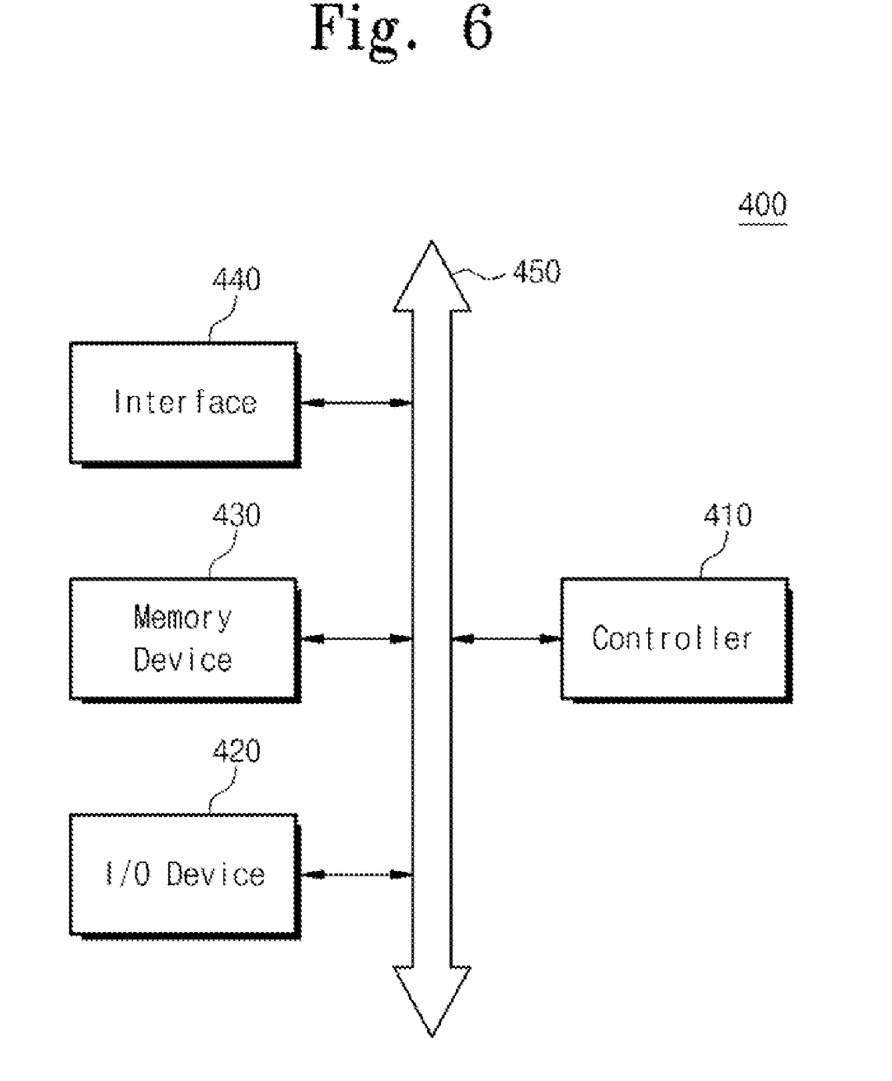
FIG. 6 is a block diagram illustrating an electronic system including a nonvolatile memory device according to an embodiment.

FIG. 6 is a block diagram illustrating an electronic system including a nonvolatile memory device according to embodiments.

Referring to FIG. 6, an electronic system 400 may include a controller 410, an input/output device 420, and a memory device 430. The controller 410, the input/output device 420, and the memory device 430 may be coupled to each other through a bus 450. The bus 450 corresponds to a transfer path of data and/or operation signals. The controller 410 may include at least one of a microprocessor, a digital signal processor, a microcontroller, and a logic device capable of performing similar functions thereto. The input/output device 420 may include at least one of a keypad, a keyboard, and a display device. The memory device 430 stores data. The memory device 430 may store data and/or commands executed by the controller 410. The memory device 430 may include the nonvolatile memory devices disclosed in the above embodiments. The electronic system 400 may further include an interface 440 for transmitting data to a communication network and receiving data from the communication network. The interface 440 may be a wire or wireless type. For example, the interface 440 may include an antenna or a wire/wireless transceiver.

The electronic system 400 may be implemented in mobile systems, personal computers, industrial computers, and other systems that perform various functions. For example, mobile systems may include personal digital assistants (PDAs), portable computers, web tablets, mobile phones, wireless phones, laptop computers, memory cards, digital music systems, and data sending/receiving systems. If the electronic system 400 can perform wireless communication, the electronic system 400 may be used in a communication interface protocol of a third-generation communication system such as Code Division Multiple Access (CDMA), Global System for Mobile Communications (GSM), North American Digital Cellular (NADC), Extended-Time Division Multiple Access (E-TDMA), and CDMA2000.

Figure 7:
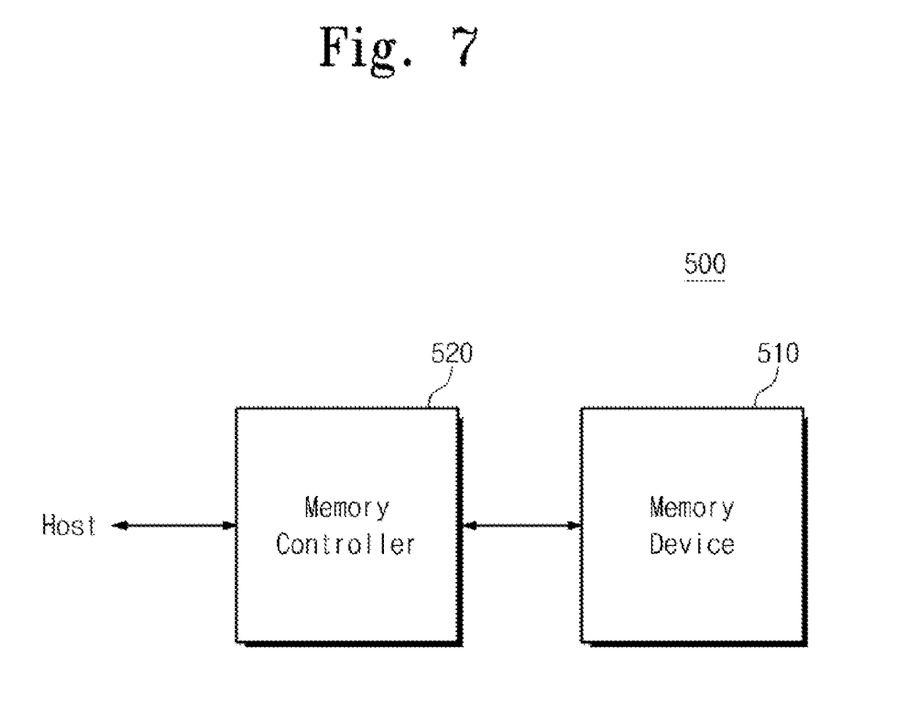
FIG. 7 is a block diagram illustrating a nonvolatile memory device according to an embodiment.

FIG. 7 is a block diagram illustrating a nonvolatile memory device according to an embodiment.

Referring to FIG. 7, a memory card 500 includes a memory device 510 and a memory controller 520. The memory device 510 can store data. The memory device 510 may have nonvolatile characteristics such that stored data is retained even when the device powered off. The memory device 510 may include the nonvolatile memory devices disclosed in the above embodiments. The memory controller 520 reads data stored in the memory device 510 or stores data into the memory device 510 in response to a read/write request of a host.

The above-disclosed subject matter is to be considered illustrative and non-limiting, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device comprising:
    a device isolation pattern defining an active region in a semiconductor substrate and extending in a first direction;
    a charge trap layer covering the active region and the device isolation pattern; and
    a plurality of word lines on the charge trap layer, the word lines crossing the active region and extending in a second direction,
    wherein the charge trap layer disposed in a first region where the word lines and the active region cross each other has a different nitrogen content ratio from the charge trap layer disposed in a second region surrounding the first region.

2. The nonvolatile memory device of claim 1, wherein the charge trap layer disposed in the first region has a smaller nitrogen content ratio than the charge trap layer disposed in the second region.

3. The nonvolatile memory device of claim 1, wherein the charge trap layer comprises silicon nitride, and the charge trap layer disposed in the second region has a greater nitrogen content ratio than a stoichiometric nitrogen content ratio.

4. The nonvolatile memory device of claim 1, wherein the number of trap sites in the first region of the charge trap layer is greater than the number of trap sites in the second region of the charge trap layer.

5. The nonvolatile memory device of claim 1, wherein the active region in the first region has an upper surface higher than an upper surface of the device isolation pattern.

6. The nonvolatile memory device of claim 5, wherein the upper surface in the first region of the active region has an arched shape protruding from a surface of the semiconductor substrate.

7. The nonvolatile memory device of claim 5, wherein the upper surface of the active region comprises:
   a flat center part; and
   a round edge part between the flat center part and the upper surface of the device isolation pattern.

8. The nonvolatile memory device of claim 1, wherein the first region of the active region has an upper surface with a height identical to or lower than a height of an upper surface of the device isolation pattern.

9. A nonvolatile memory device comprising:
   a plurality of active regions extending in a first direction in a semiconductor substrate, said active regions separated by a device isolation pattern;
   a charge trap layer covering the active region and the device isolation pattern;
   a dielectric layer covering the charge trap layer, wherein the charge trap layer comprises silicon nitride;
   a plurality of word lines extending in a second direction on the dielectric layer, wherein said word lines cross the active regions,
   wherein a first region of the charge trap layer where the word lines and the active regions cross each other has a smaller nitrogen content ratio than a second region of the charge trap layer, and the charge trap layer disposed in the second region has a greater nitrogen content ratio than a stoichiometric nitrogen content ratio, wherein the second region surrounds the first region.

* * * * *